United States Patent
Tsuzukihashi et al.

(10) Patent No.: US 7,955,583 B2
(45) Date of Patent: Jun. 7, 2011

(54) METALLIC SILICON AND METHOD FOR MANUFACTURING THE SAME

(75) Inventors: Kouji Tsuzukihashi, Akita (JP); Hiroshi Ikeda, Akita (JP); Atsuo Yanagimachi, Akita (JP); Saburo Wakita, Noda (JP)

(73) Assignees: Mitsubishi Materials Corporation, Tokyo (JP); Mitsubishi Materials Electronic Chemicals Co., Ltd., Akita (JP)

( * ) Notice: Subject to any disclaimer, the term of this patent is extended or adjusted under 35 U.S.C. 154(b) by 150 days.

(21) Appl. No.: 12/438,763

(22) PCT Filed: Aug. 31, 2007

(86) PCT No.: PCT/JP2007/067024
§ 371 (c)(1),
(2), (4) Date: Feb. 25, 2009

(87) PCT Pub. No.: WO2008/026728
PCT Pub. Date: Mar. 6, 2008

(65) Prior Publication Data
US 2009/0297425 A1    Dec. 3, 2009

(30) Foreign Application Priority Data
Aug. 31, 2006 (JP) ................. 2006-235775

(51) Int. Cl.
*C01B 33/02* (2006.01)
(52) U.S. Cl. ....................... 423/348; 423/349
(58) Field of Classification Search .............. 423/348, 423/349, 350
See application file for complete search history.

(56) References Cited

U.S. PATENT DOCUMENTS

| 4,298,423 | A | * | 11/1981 | Lindmayer | 23/296 |
| 4,539,194 | A | * | 9/1985 | Halvorsen | 423/348 |
| 4,828,814 | A | * | 5/1989 | Sanjurjo et al. | 75/433 |
| 6,090,361 | A | * | 7/2000 | Baba et al. | 423/350 |
| 6,395,249 | B1 | | 5/2002 | Kondo et al. | |
| 2002/0014574 | A1 | | 2/2002 | Wakita et al. | |
| 2005/0074388 | A1 | * | 4/2005 | Baluais et al. | 423/348 |

FOREIGN PATENT DOCUMENTS

| JP | 05-254817 A | 10/1993 |
| JP | 10-120493 A | 5/1998 |
| JP | 10-182135 A | 7/1998 |
| JP | 10-236816 A | 9/1998 |
| JP | 11-244988 A | 9/1999 |
| JP | 11-248363 A | 9/1999 |
| JP | 2001-198648 A | 7/2001 |
| JP | 2002-080215 A | 3/2002 |
| JP | 2005-303045 A | 10/2005 |
| WO | WO 99/33749 A1 | 7/1999 |

OTHER PUBLICATIONS

Machine Translation of JP2005-303045. Oct. 27, 2005.*
Machine Translation of JP10-236816. Sep. 8, 1998.*
Khattak et al., "A simple process to remove boron from metallurgical grade silicon", Solar Energy Materials and Solar Cells 74 (2002) 77-89.*

* cited by examiner

*Primary Examiner* — Stanley Silverman
*Assistant Examiner* — Anthony J Zimmer
(74) *Attorney, Agent, or Firm* — Leason Ellis LLP.

(57) ABSTRACT

This metallic silicon is manufactured by refining molten crude metallic silicon by unidirectional solidification, and has a purity of 3N or more to 6N or less and an average crystal grain diameter of 1 mm or more. This method for manufacturing the metallic silicon includes: solidifying molten crude metallic silicon in a mold which contains fine silica particles in an inner peripheral layer thereof by unidirectional solidification at a rate of 1 mm/min or less; and then cooling to 200° C. or below at a rate of 2° C./min or less.

2 Claims, No Drawings

METALLIC SILICON AND METHOD FOR MANUFACTURING THE SAME

CROSS-REFERENCE TO PRIOR APPLICATION

This is the U.S. National Phase Application under 35 U.S.C. §371 of International Patent Application No. PCT/JP2007/067024 filed Aug. 31, 2007, which claims the benefit of Japanese Patent Application No. 2006-235775 filed Aug. 31, 2006, all of which are incorporated by reference herein. The International Application was published in Japanese on Mar. 6, 2008 as WO2008/026728 A1 under PCT Article 21(2).

TECHNICAL FIELD

The present invention relates to metallic silicon having a purity and strength suitable for use as a material for general industry application, solar cell application, or other applications, and a method for manufacturing the same. More particularly, the present invention relates to metallic silicon formed from a crack-resistant metallic silicon ingot and is suitable for use as a material for general industry application, solar cell application, or other applications, and a method for manufacturing the same. The metallic silicon ingot is manufactured by melt-refining crude metallic silicon and has a purity of 3N to 6N and an average crystal grain diameter of 1 mm or more.

BACKGROUND ART

Metallic silicon is used for various applications depending on its purity. For example, metallic silicon having a purity of 2N is used as an alloy raw material or a semiconductor raw material. Metallic silicon having a purity of 6N or more is used for a semiconductor device, a target material, and for heat treatment. High-purity polycrystalline silicon having a purity of 10N to 11N is used as a semiconductor material or a material for solar cell application. High-purity monocrystalline silicon having a purity of 11N or more is used as a material for semiconductor device application.

Metallic silicon is lightweight and its thermal conductivity is greater than that of stainless steel so that metallic silicon may be used as an alternative to stainless steel in various devices. However, existing metallic silicon used as a semiconductor material generally has a purity of 6N or more. That purity is excessively high for a material for general industry application such as an alternative to stainless steel or quartz, and is thus less cost-effective. On the other hand, existing metallic silicon having a purity of 2N which is generally used as an alloy raw material is not suitable for use as a material for general industry application because of its poor crystallinity and difficulty in achieving reliable material strength. In particular, for example, metallic silicon with an average crystal grain diameter of less than 1 mm has insufficient material strength, and thus is not suitable for an alternative to stainless steel or quartz. Furthermore, since metallic silicon having a purity of about 2N generally has a short lifetime average value, its photoelectric conversion efficiency is low; therefore, it is unsuited for use as a material for solar cell application. Metallic silicon having a purity of 6N or more has higher photoelectric conversion efficiency; however, its purity is excessively high, and is thus less cost-effective.

A method for manufacturing high-purity metallic silicon is proposed which includes melting crude metallic silicon, and unidirectionally-solidifying and refining the molten crude metallic silicon (Patent Documents 1 and 2). However, in the case in which metallic silicon having a purity of about 3N to 5N is manufactured by melt-refining crude metallic silicon in this method, the ingot may crack easily unless the solidification rate after melting and the cooling rate after solidification are controlled appropriately. Therefore, it is impossible to obtain metallic silicon suitable for a material for general industry application. For this reason, existing metallic silicon having a purity of about 3N to 5N is generally not used as a material for general industry application.

Patent Documents 1: Japanese Patent Application, Publication No. H5-254817

Patent Documents 2: Japanese Patent Application, Publication No. H10-182135

DISCLOSURE OF THE INVENTION

Problems to be Solved by the Invention

The present invention has been made to solve the aforementioned problems and relates to metallic silicon having a purity suitable for a material for general industry application, solar cell application and other applications, and a method for manufacturing the same. The invention aims to obtain a crack-resistant metallic silicon ingot having the moderate purity and the moderate average crystal grain diameter by melt-refining crude metallic silicon.

Means to Resolve the Problem

In accordance with the present invention, low-purity metallic silicon and a method for manufacturing the same are provided which have solved the aforementioned problems by the following configurations.

The metallic silicon of the invention is manufactured by refining molten crude metallic silicon by unidirectional solidification, and has a purity of 3N or more to 6N or less and an average crystal grain diameter of 1 mm or more.

The metallic silicon may be manufactured by solidifying the molten crude metallic silicon in a mold by unidirectional solidification at a rate of 1 mm/min or less and then cooling to 200° C. or below at a rate of 2° C./min or less, the mold may contain fine silica particles in an inner peripheral layer thereof, and the metallic silicon may have a purity of 3N or more to 6N or less and an average crystal grain diameter of 1 mm or more.

Each of an iron content and an aluminum content may be in a range from 0.05 to 0.00005 wt % and a total content of other metallic elements may be in a range from 0.03 wt % or less. The total content of the other metallic elements may preferably be 0.01 wt % or less.

The metallic silicon may be used for a material for general industry application or solar cell application.

The method for manufacturing metallic silicon of the present invention includes: solidifying molten crude metallic silicon in a mold which contains fine silica particles in an inner peripheral layer thereof by unidirectional solidification at a rate of 1 mm/min or less; and then cooling to 200° C. or below at a rate of 2° C./min or less, thereby, manufacturing metallic silicon having a purity of 3N or more to 6N or less and an average crystal grain diameter of 1 mm or more.

The solidification rate may be 0.1 to 1 mm/min and the cooling rate may be 0.1 to 2° C./min.

Effects of the Invention

The metallic silicon of the present invention is manufactured by refining molten crude metallic silicon by unidirectional solidification and has a purity of 3N or more to 6N or less. Therefore, the metallic silicon of the present invention can be obtained or manufactured inexpensively compared to high-purity silicon used as a semiconductor material, and is thus suitable for use as a material for general industry application. The metallic silicon of the present invention contains, for example, each of iron and aluminum in an amount of 0.05 to 0.00005 wt % and other metallic elements in an amount of 0.03 wt % or less, preferably 0.01 wt % or less, in total content. Such purity is lower than that of metallic silicon used as a semiconductor material. Accordingly, the metallic silicon of the present invention can be manufactured at a lower cost than that of high-purity silicon for a semiconductor material, and therefore can be obtained relatively inexpensively.

The metallic silicon of the present invention is manufactured by refining crude metallic silicon by unidirectional solidification. Since the solidification rate and the cooling rate are controlled within certain ranges during a manufacturing process, a crack-resistant metallic silicon ingot can be obtained. The obtained metallic silicon ingot is processed to give a metallic silicon member having strength sufficient for a material for general industry application as an alternative to stainless steel member or quartz member.

The method for manufacturing metallic silicon includes unidirectionally-solidifying molten crude metallic silicon in an ingot mold at a solidification rate of 1 mm/min or less, preferably 0.1 to 1 mm/min, and then cooling to 200° C. or below at a cooling rate of 2° C./min or less, preferably 0.1 to 2° C./min, wherein the ingot mold includes fine silica particles in an inner peripheral layer thereof. In this manufacturing method, metallic silicon can be obtained which has characteristics suitable for a material for general industry application or solar cell application.

BEST MODE FOR CARRYING OUT THE INVENTION

Hereinafter, the present invention will be described in detail with reference to its embodiments.

Metallic silicon of the present invention is manufactured by refining molten crude metallic silicon by unidirectional solidification. The metallic silicon has a purity of 3N (99.9%) or more to 6N (99.9999%) or less and an average crystal grain diameter of 1 mm or more. In particular, for example, the metallic silicon is manufactured by unidirectionally-solidifying molten crude metallic silicon in a mold at a rate of 1 mm/min or less and then cooling to 200° C. or below at a rate of 2° C./min or less, wherein the mold includes fine silica particles in an inner peripheral layer thereof. The metallic silicon has a purity of 3N (99.9%) or more to 6N (99.9999%) or less and an average crystal grain diameter of 1 mm or more.

As the molten crude metallic silicon, metallic silicon can be used which has a purity of about 2N (99%) purity and is generally used as an alloy material or a semiconductor material. This metallic silicon is placed in an ingot mold, heated and melted to provide molten crude metallic silicon. The ingot mold may preferably include fine silica particles (for example, fine fused silica sand having a particle diameter of 50 to 300 μm) in an inner peripheral layer thereof.

Conventionally, an ingot mold including silicon nitride in an inner peripheral layer thereof as a releasing agent is commonly used. High-purity metallic silicon used as a semiconductor material reacts less easily with silicon nitride, and thus excellent releaseability is realized. However, with regard to metallic silicon having a purity of about 3N to 6N, since impurities in the silicon react with silicon nitride, releaseability is decreased. The molten crude metallic silicon sticks to the ingot mold at an area of which the releaseability is decreased. This may cause stress that prevents shrinkage of the ingot when the ingot solidifies and shrinks in volume during casting. As a result, the ingot may crack easily.

To address this problem, a crucible for manufacturing an ingot is known which includes an inner layer containing fine fused silica sand (Japanese Patent Application, Publication No. H11-248363, Japanese Patent Application, Publication No. H11-244988, and Japanese Patent Application, Publication No. 2001-198648). In the disclosed crucibles, an inner peripheral surface is released due to stress at the time of solidification of the silicon; thereby, cracks in the silicon ingot are prevented.

In particular, Japanese Patent Application, Publication No. H11-248363 discloses a crucible for manufacturing an ingot which includes a stacked configuration having an inner silica layer and an outer silica layer provided outside of the inner silica layer. The inner silica layer includes fine fused silica particles having an average particle diameter of 50 to 300 μm. The outer silica layer includes coarse fused silica particles having an average particle diameter of 500 to 1500 μm. The fine fused silica particles are bonded together in the inner layer via colloidal silica-containing slurry, and the coarse fused silica particles are also bonded together in the outer layer via colloidal silica-containing slurry. Japanese Patent Application, Publication No. H11-244988 discloses a crucible for manufacturing an ingot in which an inner silica layer containing fine fused silica particles having an average particle diameter of 50 to 300 μm is formed on an inner peripheral surface of a graphite mold. The metallic silicon of the present invention is manufactured by using an ingot mold which has an inner silica layer containing fine fused silica particles having an average particle diameter of 50 to 300 μm as described above. Here, in the case in which metallic silicon is melt-refined in a mold in which a releasing agent containing silicon nitride is applied thereon, the silicon ingot may crack even if the solidification rate and the cooling rate are controlled within the ranges of the present invention (Comparative Example 5).

The metallic silicon of the present invention is manufactured while controlling the solidification rate and the cooling rate of molten crude metallic silicon in order to prevent cracking of the ingot. In particular, the molten crude metallic silicon is solidified by unidirectional solidification at a solidification rate controlled to 1 mm/min or less, preferably 0.1 to 1 mm/min, and then cooled to 200° C. or below at a cooling rate controlled to 2° C./min or less, preferably 0.1 to 2° C./min. In this manner, the metallic silicon of the present invention is manufactured.

In the case in which the solidification rate is more than 1 mm/min, for example, the molten crude metallic silicon is solidified at the solidification rate of 2 mm/min, and then is cooled to 200° C. or below at the cooling rate of 1° C./min, a crack-resistant ingot is obtained if a mold is used which contains fine silica particles in an inner peripheral layer. However, the obtained ingot has a purity that is almost the same as that of a raw material. Thus, no purification effect is exhibited (Comparative Example 1). In the case in which the solidification rate is 2 mm/min, since the solidification rate is excessively high, a first solidified portion begins cooling before a surface of the metallic silicon is not sufficiently solidified even when the cooling rate is set to 2° C./min. As a result, the ingot cracks (Comparative Example 2). In the case in which the cooling rate is more than 2° C./min, for example, 3° C./min, the ingot also cracks (Comparative Example 3). In the case in which the taking-out temperature is higher than 200° C., for example, 300° C., the ingot also cracks even when the cooling rate is 2° C./min or less (Comparative Example 4).

A crack-resistant metallic silicon ingot having a purity of 3N or more to 6N or less can be obtained in the following manner. A mold is used which contains fine silica particles in an inner peripheral layer thereof, and molten crude metallic silicon is solidified by unidirectional solidification at a solidification rate of 1 mm/min or less, preferably 0.1 to 1 mm/min, and then cooled to 200° C. or below at a cooling rate of 2° C./min or less, preferably 0.1 to 2° C./min. In particular, a metallic silicon can be obtained which contains each of iron and aluminum in an amount of 0.05 to 0.00005 wt % (weight percentage) and other metallic elements in an amount of 0.03 wt % or less in total content. The total content of the other metallic elements may preferably be 0.01 wt % or less.

For example, in Example 1, the metallic silicon was obtained which contained 0.03 wt % of iron, 0.03 wt % of aluminum, 0.01 wt % of calcium, 0.001 wt % of sodium, 0.001 wt % of potassium, 0.001 wt % of chromium, and 0.01 wt % of copper. In Example 2, the metallic silicon was obtained which contained 0.003 wt % of iron, 0.003 wt % of aluminum, 0.001 wt % of calcium, 0.0001 wt % of sodium, 0.0001 wt % of potassium, 0.0001 wt % of chromium, and 0.001 wt % of copper. In Example 3, the metallic silicon was obtained which contained 0.00003 wt % of iron, 0.00003 wt % of aluminum, 0.0001 wt % of calcium, 0.00001 wt % of sodium, 0.00001 wt % of potassium, 0.00001 wt % of chromium, and 0.0001 wt % of copper.

In the case in which the solidification rate is more than 1 mm/min, crystal growth becomes insufficient, and thus it is difficult to obtain metallic silicon having an average crystal grain diameter of 1 mm or more (Comparative Example 1). In the case in which the solidification rate is less than 1 mm/min, the crystal growth time becomes sufficient to obtain metallic silicon having a large average crystal grain diameter. In particular, in the cases in which the solidification rates are 1 mm/min, 0.1 mm/min, and 0.05 mm/min, the average crystal grain diameters of the obtained metallic silicon are 2 mm, 4 mm, and 10 mm, respectively. Accordingly, the lower the solidification rate, the greater the average crystal grain diameter of the obtained metallic silicon (Examples 1 to 3).

Metallic silicon having a large average crystal grain diameter has a longer lifetime (career lifetime). Also, the percentage of portions in the ingot of which the measured lifetimes are within a range of −20% to 20% of the lifetime average value becomes high. This means that the ingot has excellent uniformity. Accordingly, metallic silicon having high photoelectric conversion efficiency can be obtained.

In particular, as shown in Examples 1 to 3 in Table 1, in the case in which the average crystal grain diameters of the metallic silicon crystals are 2 mm, 4 mm, and 10 mm, the lifetime average values are 0.3 μsec, 0.5 μsec, and 1.0 μsec, respectively, and the percentages of portions of which the measured lifetimes are within a range of −20% to 20% of the lifetime average value are 55%, 60%, and 70%, respectively. Accordingly, the photoelectric conversion efficiency becomes gradually higher as 5%, 7%, and 10%.

EXAMPLES

Examples of the present invention will be shown below together with Comparative Examples.

[Raw Materials]

Crude metallic silicon having a purity of 2N (Fe: 0.3%, Al: 0.3%, Ca: 0.1%, Na: 0.01%, K: 0.01%, Cr: 0.01%, and Cu: 0.1%) was used in an amount of 5000 g as a raw material.

[Ingot Mold]

A 1-liter mold (10 cm in length×10 cm in width×10 cm in height) was used which included an inner layer (5 mm thick) containing fine fused silica particles of 50 to 300 μm. Here, in Comparative Example 5, a mold was used which had the same capacity but contained silicon nitride in an inner surface layer thereof.

[Solidifying and Cooling Conditions]

In accordance with the conditions shown in Table 1, molten crude metallic silicon was solidified and cooled. Duration of the solidifying process was determined while observing a surface state of the metallic silicon in the mold. Subsequently, the metallic silicon was cooled. A temperature at which the metallic silicon was taken out was determined from a measuring result of a surface temperature of the metallic silicon.

[Average Crystal Grain Diameter]

A cross section of the obtained metal ingot was observed by using a microscope to determine the average crystal grain diameter.

[Lifetime Average Value]

The lifetime of the metallic silicon ingot was measured along the height direction using a lifetime measuring system (model WT-2000 manufactured by SEMILAB). A lifetime average value was obtained by averaging measured values in central measuring areas distributed almost equally in the metallic silicon ingot.

[Percentage of Lifetime Values within Range of −20% to 20% of Lifetime Average Value]

Among the measuring points, percentage (%) of the number of measuring points (L1) of which the lifetime values were within the range of −20% to +20% of the lifetime average value with respect to the total number of the measuring points (L0) is shown as L0/L1×100.

[Photoelectric Conversion Efficiency]

The metallic silicon was irradiated with sunlight for measurement of current and voltage using a current-voltage measuring device. The photoelectric conversion efficiency was obtained from the following equation.

Calculating formula: Photoelectric conversion efficiency (%)=$Jsc \times Voc \times FF$ Isc: short-circuit current (current under voltage of 0V)

Voc: open circuit voltage (voltage under current of 0A)

FF: a fill factor (a value obtained by dividing Voc×Isc by an area of a solar cell base)

Jsc: short circuit current density (a value obtained by dividing Isc by an area of a solar cell base)

Manufacturing conditions and results are shown in Table 1. Here, because the metallic silicon of Comparative Examples 2 to 5 cracked during cooling, their purity and average crystal grain diameters were not measured. Since the lifetime average value and the photoelectric conversion efficiency were not able to be measured in cracked metal ingots, these values were not obtained.

TABLE 1

| | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| [Mold] | | | | | | | | |
| Inner peripheral layer | Containing fine $SiO_2$ | Containing fine $SiO_2$ | Containing fine $SiO_2$ | Containing fine $SiO_2$ | Containing fine $SiO_2$ | Containing fine $SiO_2$ | Containing fine $SiO_2$ | Containing silicon nitride |
| [Melting process] | | | | | | | | |
| Raw metallic silicon purity | 2N | 2N | 2N | 2N | 2N | 2N | 2N | 2N |
| Heating temperature · Duration | 1500° C. · 5 h | 1500° C. · 5 h | 1500° C. · 5 h | 1500° C. · 5 h | 1500° C. · 5 h | 1500° C. · 5 h | 1500° C. · 5 h | 1500° C. · 5 h |
| [Solidifying process] | | | | | | | | |
| solidification rate (mm/min) | 1 | 0.1 | 0.05 | 2 | 2 | 2 | 1 | 1 |
| Duration (h) | 1 | 10 | 20 | 0.5 | 0.5 | 0.5 | 1 | 1 |
| [Cooling process] | | | | | | | | |
| Cooling rate (° C./min) | 2° C. | 1° C. | 1° C. | 1° C. | 2° C. | 3° C. | 2° C. | 2° C. |
| Duration (h) | 10 | 20 | 20 | 20 | 10 | 7.7 | 10 | 10 |
| Taking-out temperature | 200° C. | 150° C. | 200° C. | 200° C. | 200° C. | 200° C. | 300° C. | 200° C. |
| [Metallic silicon] | | | | | | | | |
| Purity | 3N (99.9%) | 4N (99.99%) | 6N (99.9999%) | 2N (99%) | Not measured | Not measured | Not measured | Not measured |
| Impurities (wt %) | Fe: 0.03% Al: 0.03% Ca: 0.01% Na: 0.001% K: 0.001% Cr: 0.001% Cu: 0.01% | Fe: 0.003% Al: 0.003% Ca: 0.001% Na: 0.0001% K: 0.0001% Cr: 0.0001% Cu: 0.001% | Fe: 0.00003% Al: 0.00003% Ca: 0.0001% Na: 0.00001% K: 0.00001% Cr: 0.00001% Cu: 0.0001% | Fe: 0.3% Al: 0.3% Ca: 0.1% Na: 0.01% K: 0.01% Cr: 0.01% Cu: 0.1% | | | | |
| Ingot state | No crack | No crack | No crack | No crack, but raw material was not purified | Cracked | Cracked | Cracked | Cracked |
| Average crystal grain diameter (mm) | 2 | 4 | 10 | 0.5 | — | — | — | — |
| Life time average value (microseconds) | 0.3 | 0.5 | 1 | 0.05 | — | — | — | — |
| Percentage of life time values within range of −20% to +20% of lifetime average value | 55% | 60% | 70% | 20% | — | — | — | — |
| Photoelectric conversion efficiency (%) | 5 | 7 | 10 | 1 | — | — | — | — |

As shown in Table 1, in accordance with the manufacturing method of the present invention, crack-resistant metallic silicon having a purity of 3N or more to 6N or less was obtained. The obtained metallic silicon had greater thermal conductivity than that of stainless steel, and had an average crystal grain diameter of 2 mm or more, providing sufficient strength. Therefore, the obtained metallic silicon is suitable as a material for general industry application. Furthermore, the obtained metallic silicon had high photoelectric conversion efficiency, and thus is suitable for a material for solar cell application.

On the other hand, the metallic silicon of Comparative Example 1 had a purity of 2N indicating that a refining effect was not exhibited. Furthermore, the average crystal grain diameter was 0.5 mm which was small. The lifetime average value was 0.05 μsec which was short. The percentage of lifetime values within the range of −20% to +20% of the lifetime average value was 20%, and this indicates poor uniformity of the metallic silicon. The photoelectric conversion efficiency was 1% which was low. In Comparative Examples 2 to 5, the metallic silicon ingot of cracked during solidifying and cooling processes. As a result, metallic silicon with targeted properties was not obtained.

INDUSTRIAL APPLICABILITY

The metallic of the present invention has a purity of 3N or more to 6N or less and an average crystal grain diameter of 1 mm or more, and is crack-resistant. That metallic silicon can be manufactured relatively inexpensively, and is suitable for use as a material for general industry application such as an alternative to stainless steel or quartz. Since the obtained metallic silicon has a large average crystal grain diameter, high photoelectric conversion efficiency can be realized.

Accordingly, the metallic silicon is also suitable for use as a material for solar cell application.

The invention claimed is:

1. A method for manufacturing metallic silicon, the method comprising: solidifying molten crude metallic silicon in a mold which contains fine silica particles in an inner peripheral layer thereof by unidirectional solidification at a rate of 1 mm/min or less; and then cooling to 200° C. or below at a rate of 2° C./min or less, thereby, manufacturing metallic silicon having a purity of 3N or more to 6N or less and an average crystal grain diameter of 1 mm or more.

2. The method for manufacturing metallic silicon according to claim 1, wherein the solidification rate is 0.1 to 1 mm/min and the cooling rate is 0.1 to 2° C./min.

* * * * *